US008889539B2

(12) United States Patent
Ryu et al.

(10) Patent No.: US 8,889,539 B2
(45) Date of Patent: Nov. 18, 2014

(54) RECESS GATE TRANSISTOR (75) Inventors: Ho-In Ryu, Suwon-si (KR); Bong-Su Kim, Sungnam-si (KR); Dae-Ik Kim, Yongin-si (KR); Ho-Jun Lee, Yongin-si (KR); Dae-Young Jang, Hwasung-si (KR); Si-Hyung Lee, Suwon-Si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 589 days.

(21) Appl. No.: 12/332,877

(22) Filed: Dec. 11, 2008

(65) Prior Publication Data
US 2009/0261420 A1 Oct. 22, 2009

(30) Foreign Application Priority Data

Apr. 17, 2008 (KR) ........................ 10-2008-0035817

(51) Int. Cl.
*H01L 21/302* (2006.01)
*H01L 29/66* (2006.01)
*H01L 29/423* (2006.01)

(52) U.S. Cl.
CPC ...... *H01L 29/4236* (2013.01); *H01L 29/66621* (2013.01)
USPC ........... 438/589; 438/585; 438/592; 438/259; 438/270; 257/E21.214

(58) Field of Classification Search
CPC .................. H01L 29/4236; H01L 29/66621
USPC .......... 257/368, E21.214; 438/589, 585, 592, 438/259, 270, 242
See application file for complete search history.

(56) References Cited

U.S. PATENT DOCUMENTS 5,118,384 A * 6/1992 Harmon et al. ............... 438/717
5,686,330 A * 11/1997 Farb et al. ..................... 438/193
6,291,298 B1 * 9/2001 Williams et al. .............. 438/270
(Continued)

FOREIGN PATENT DOCUMENTS

JP 07-106560 4/1995
JP 2003-023150 1/2003
(Continued)

OTHER PUBLICATIONS

Kim et al., "The Breakthrough in data retention time of Dram using Recess-Channel-Array Transistor (RCAT) for 88nm feature size and beyond", 2003 Symposium on VLSI Technology Digest of Technical Papers, 2 pages ("Kim").*
(Continued)

*Primary Examiner* — Tom Thomas
*Assistant Examiner* — Benjamin T Liu
(74) *Attorney, Agent, or Firm* — F. Chau & Associates, LLC (57) ABSTRACT A method of forming a semiconductor device is provided, comprising forming a plurality of hard masks on a substrate by patterning an insulating layer; forming a plurality of trenches in the substrate, each trench having trench walls disposed between two adjacent masks and extending vertically from a bottom portion to an upper portion; forming an insulating layer on the hard masks and the trench walls; forming a conductive layer on the insulating layer; etching the conductive layer to form conductive layer patterns to fill the bottom portions of the trenches; depositing a buffer layer on the conductive layer patterns and the trench walls; and filling the upper portions of the trenches with a capping layer.

2 Claims, 10 Drawing Sheets

(56) References Cited

U.S. PATENT DOCUMENTS

| | | | |
|---|---|---|---|
| 6,359,308 B1 * | 3/2002 | Hijzen et al. | 257/341 |
| 6,365,953 B2 * | 4/2002 | Begley et al. | 257/513 |
| 6,376,315 B1 | 4/2002 | Hshieh et al. | |
| 6,465,325 B2 * | 10/2002 | Ridley et al. | 438/428 |
| 7,005,302 B2 | 2/2006 | Xiang | |
| 7,476,920 B2 * | 1/2009 | Schloesser | 257/296 |
| 7,785,952 B2 | 8/2010 | Chang et al. | |
| 7,838,920 B2 | 11/2010 | Ghodsi | |
| 7,867,851 B2 * | 1/2011 | Hanson et al. | 438/268 |
| 7,935,595 B2 | 5/2011 | Shiratake | |
| 8,577,423 B2 | 11/2013 | Matsuoka | |
| 2002/0130359 A1 * | 9/2002 | Okumura et al. | 257/330 |
| 2002/0160573 A1 * | 10/2002 | Peake et al. | 438/270 |
| 2006/0113605 A1 * | 6/2006 | Currie | 257/368 |
| 2007/0075361 A1 | 4/2007 | Luyken et al. | |
| 2007/0190728 A1 * | 8/2007 | Sreekantham et al. | 438/270 |
| 2009/0215237 A1 * | 8/2009 | Disney et al. | 438/270 |

FOREIGN PATENT DOCUMENTS

| | | |
|---|---|---|
| JP | 2003-037185 | 2/2003 |
| JP | 2006-339476 | 12/2008 |
| KR | 1020050025206 | 3/2005 |
| KR | 1020070003136 | 1/2007 |
| KR | 1020070028068 | 3/2007 |
| KR | 1020070055239 | 5/2007 |
| KR | 1020070071636 | 7/2007 |

OTHER PUBLICATIONS

Korean Official Communication Date Mar. 14, 2014.

\* cited by examiner

RECESS GATE TRANSISTOR

CROSS-REFERENCE TO RELATED APPLICATIONS

This application claims priority under 35 USC §119 to Korean Patent Application No. 10-2008-0035817, filed on Apr. 17, 2008, in the Korean Intellectual Property Office (KIPO), the disclosure of which is incorporated by reference herein in its entirety.

BACKGROUND OF INVENTION

1. Technical Field

The present disclosure relates to semiconductor technology; more particularly, to a recess gate and a method of fabricating a semiconductor device with the same.

2. Discussion of Related Art

Recess Channel Array Transistors (RCATs) and Buried Channel Array Transistors (BCATs) have improved operation characteristics as compared to planar transistors and are therefore widely used in semiconductor devices including memory devices. For example, planar transistors have shorter conduction channels compared to RCATs or BCATs. The short conduction channels suffer from the commonly known short channel effects (SCE), which exhibits characteristics such as source to drain leakage, reduced carrier mobility and increased difficulty in controlling threshold voltages. RCATs and BCATs have increased channel lengths, decreased leakage effects, but also decreased drive or ion current Ion. Transistor performance characteristics vary dependent upon a number of factors, including the types of conductive materials used to form the gates of the BCATs or RCATs, the gate length, the thickness of the side walls and insulation layer, and so on.

SUMMARY OF THE INVENTION

A method of forming a semiconductor device is provided, comprising: forming at least two trenches extending vertically from a bottom portion to an upper portion; forming a second insulating layer on the trenches including the trench walls; forming a conductive layer on the second insulating layer; removing the conductive layer from the upper portion of the trenches, with a conductive layer pattern remaining at the bottom portion of the trenches; depositing a buffer layer on the conductive layer patterns and the trench walls; and filling the upper portions of the trenches with a capping layer.

According to an exemplary embodiment of the present invention, the first insulating material may be made from silicon nitrite and the second insulating material may be made from silicon oxide. The gate-to-gate dimension may be 0.1 um or less. The conductive material may be made from a metal group consisting of one of Ti, TiN, W, WN, Ta, TaN, Co, C, Rb, or Ru. The buffer layer is made of silicon oxide and the capping layer may be an insulator made from one of an oxide, nitride, SiO2, SiON, SixNy, or silicon nitride. The etch selectivity of the capping layer is higher than that of the buffer layer.

According to another exemplary embodiment of the present invention, the step of forming a plurality of hard masks includes forming a polysilicon layer on the substrate prior to forming the first insulating layer.

According to another exemplary embodiment of the present invention, a semiconductor device is provided, comprises: a substrate having a plurality of trenches, each of the trenches disposed between contacts formed on the top surface of an ILD layer formed on the substrate, each trench having trench walls and extending vertically from a bottom portion to an upper portion; an insulating layer formed on the trenches including the bottom portions and the trench walls; a conductive layer pattern formed at the bottom portion of each of the trenches; a buffer layer formed on the conductive layer pattern and the trench walls; and a cap formed on the buffer layer from above the conductive layer patterns to the top of the trenches. The distance from trench-to-trench is 0.1 um or less.

According to this embodiment, the substrate is partitioned into a cell region, a core region, and a peripheral region, wherein the trenches are disposed in the cell region and not in the core region or the peripheral region. The buffer layer is made of silicon oxide, and the cap is made of silicon nitride. The ILD layer is made of BPSG and the cap comprises more than one capping layer.

According to an alternative embodiment, the conductive layer pattern comprises a first conductive layer and a second conductive layer made of different conductive materials, wherein the first conductive layer is made from a metal group and the second conductive layer is made from polysilicon.

According to another exemplary embodiment of the present invention, a method of forming a semiconductor device, comprising: forming a plurality of hard masks on a substrate by patterning an insulating layer; forming a plurality of trenches in the substrate, each trench having trench walls disposed between a pair of masks and extending vertically from a bottom portion to an upper portion; forming an insulating layer on the trenches including the trench walls; forming a first conductive layer on the insulating layer; etching the first conductive layer to form first conductive layer patterns to fill the bottom portions of the trenches; forming a second conductive layer on the first conductive layer patterns; etching the second conductive layer to form second conductive layer patterns above the first conductive layer patterns; depositing a buffer layer on the second conductive layer patterns and the trench walls; and filling the upper portions of the trenches with a capping layer, wherein the first conductive layer pattern is formed from a metal layer and the second conductive layer pattern is formed from a polysilicon layer.

According to one embodiment wherein the trenches form part of an NMOS device and the metal layer has a workfunction equal to or greater than a workfunction of the polysilicon layer. According to an alternative embodiment wherein the trenches form part of a PMOS device and the metal layer has a workfunction equal to or less than a workfunction of the polysilicon layer.

According to another embodiment, the metal layer is selected from a group consisting of Ti, TiN, W, WN, Ta, TaN, Co, C, Rb, and Ru, and the second conductive layer is selected from a group consisting of one of Ti, TiN, W, WN, Ta, TaN, Co, C, Ru or Rb. The first insulating material is silicon nitride and the second insulating material is silicon oxide. The dimension from trench to trench is 0.1 um or less.

According to another embodiment of the present invention, after the step of etching the capping layer, depositing a second capping layer on the etched capping layer to form first and second capping patterns. The buffer layer is made of silicon oxide and the capping layer is made of silicon nitride.

The method further includes planarizing the hard masks and the capping layer; depositing an interlayer dielectric (ILD) layer on the substrate; and etching the ILD layer to form contact holes, wherein the etch selectivity of the ILD is higher than the etch selectivity of the buffer layer. The etch selectivity of the capping layer is higher than that of the buffer layer. The step of forming a plurality of hard masks includes forming a polysilicon layer on the substrate prior to forming the first insulating layer.

According to still another embodiment of the present invention, a method of forming a semiconductor device comprising: forming a substrate and an active layer at a top portion of the substrate; forming a polysilicon layer on the active layer; forming a first insulation layer on the polysilicon layer; forming a plurality of masks by patterning the first insulating layer and the polysilicon layer; forming a plurality of trenches having trench walls in the substrate, each trench disposed between two adjacent masks and extending vertically from a bottom portion to an upper portion; forming a second insulating layer on the trench walls; forming a conductive layer on the second insulating layer; etching the conductive layer to form conductive layer patterns to fill the bottom portions of the trenches to a height; depositing a buffer layer on the conductive layer patterns and the trench walls; filling the upper portions of the trenches with a capping layer; planarizing the capping layer, the buffer layer, and the hard masks to expose the active layer at the top portion of the substrate; forming an ILD layer on active layer, the buffer layer, and the capping layer; and etching the ILD layer above the active layer to form contact holes, wherein the etch selectivity from the ILD layer to the capping layer is higher than the etch selectivity from the ILD layer to the buffer layer.

A semiconductor memory card, comprising: a memory controller and a memory device, the memory controller controls the memory device to read or write data from/into the memory in response to a read/write request of a host, wherein the memory device includes the device. The distance from trench-to-trench is 0.1 um or less. The host is a mobile device or a processing device having a processor.

The semiconductor memory card, further including a wireless interface for communicating with another cellular device and a connector for removably connecting to a host system, wherein the host system is one of a personal computer, notebook computer, hand held computing device, camera, or audio reproducing device.

An electronic device comprising: a controller having a processor; an input/output (I/O) device; a memory device; and a wireless interface, wherein the memory device includes a semiconductor device comprises: a substrate having a plurality of trenches, each of the trenches disposed between contacts formed on the top surface of an ILD layer formed on the substrate, each trench having trench walls and extending vertically from a bottom portion to an upper portion; an insulating layer formed on the trenches including the bottom portions and the trench walls; a conductive layer pattern formed at the bottom portion of each of the trenches; a buffer layer formed on the conductive layer pattern and the trench walls; and a cap formed on the buffer layer from above the conductive layer patterns to the top of the trenches.

The I/O device includes a display, wherein the wireless interface transmits or receives data via a wireless communication network. Further the wireless communication network communicates in a communication interface protocol of a third generation communication system, including one of code division multiple access (CDMA), global system for mobile communications (GSM), north American digital cellular (NADC), extended-time division multiple access (E-TDMA), wide band code division multiple access (WCDMA), or CDMA2000.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF EXEMPLARY EMBODIMENTS

A recess gate and a method for fabricating a semiconductor device in accordance with preferred embodiments of the present invention will be described in detail herein. The semiconductor device fabricated according to at least one embodiment of the present invention includes use of metallic materials to form a recess gate to enhance transistor drive characteristics for ultra compact integration, but metal contamination, recess side wall gate oxide attack, or stress damage issues associated with ultra compact integration have been minimized.

The invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. It will also be understood that when an element is referred to as being "connected" or "coupled" to another element, it can be directly connected or coupled to the other element or intervening elements may be present. Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the Figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Some embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention. It will also be appreciated by those of skill in the art that references to a structure or feature that is disposed "adjacent" another feature may have portions that overlap or underlie the adjacent feature.

In the present disclosure, the terms "recess" and "trench" are used interchangeably and they convey the same meaning throughout.

Figure 1:
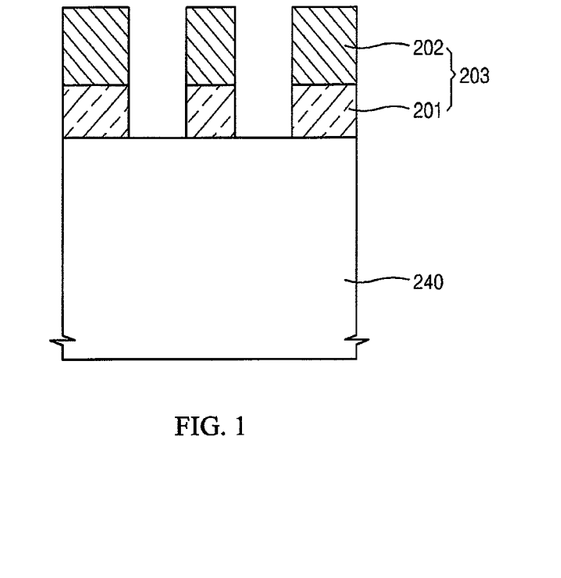
FIG. 1 is a cross-sectional view illustrating a process of forming a recess transistor device according to an exemplary embodiment of the present invention.

A recess gate and a method of fabricating a semiconductor device with the same in accordance with preferred embodiments of the present invention will be described in detail with reference to the accompanying drawings. Referring to FIG. 1, a substrate 240 based on a material such as silicon is first formed. An insulation layer is deposited on the substrate 240 and a hard mask 203 is formed by patterning the insulation layer 202. According to an exemplary embodiment of the present invention, SiN is the material used for the insulation layer 202. A hard mask is formed by patterning the SiN layer 202. According to an alternative embodiment of the present invention, a polysilicon layer 201 is first formed on the substrate 240 prior to forming of the SiN layer 202. Compared to SiN, the material used for the SiN layer 202, polysilicon, the material used for the polysilicon layer 201, is a better interface with silicon, the material used to form the substrate 240; as such, the surface of the substrate 204 would be more uniform and less prone to damage due to material mismatch then with the polysilicon interlayer. In fabricating transistors for use in more dense regions of a circuit, such as the cell regions of a memory device, the design rules are smaller and use of a polysilicon layer 201 to interface the substrate 204 would enhance component connectivity and circuit performance. According to an exemplary embodiment of the present invention, a recess gate transistor thus form is in accordance of a design rule that is 50 nm or less. The gate-to-gate dimension is 0.1 um or less. It is contemplated that according to this embodiment of the present invention, the substrate is partitioned into a cell region, a core region, and a peripheral region, and the recess gates are disposed in the cell region and not in the core region or the peripheral region.

For purposes of illustration, embodiments of the present invention are described heretofore with the hard mask 203 comprising both the SiN layer 202 and the polysilicon layer 201, but it is understood that the hard mask can comprise solely the SiN layer 202 or the polysilicon layer 201.

Figure 2:
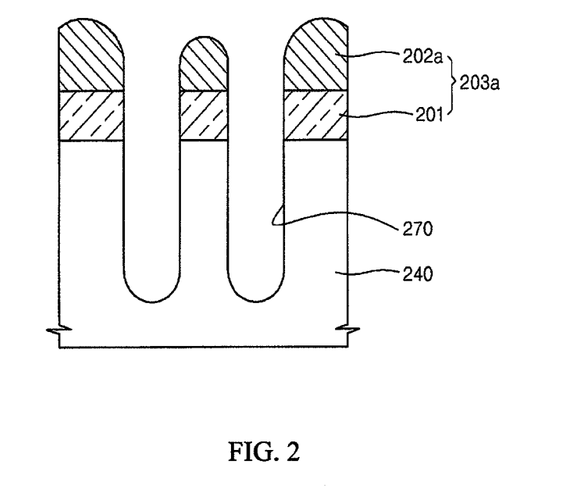
FIG. 2 is a cross-sectional view illustrating a process of forming a recess transistor device according to an exemplary embodiment of the present invention.

Referring to FIG. 2, recesses 270 are formed in the spacing between the hard mask SiN patterns 202 by etching the portions of substrate 240 not covered by the hard mask 203 to a predetermined depth. Portions of the SiN patterns 202 can be etched as well, forming etched SiN patterns 202a.

Figure 3:
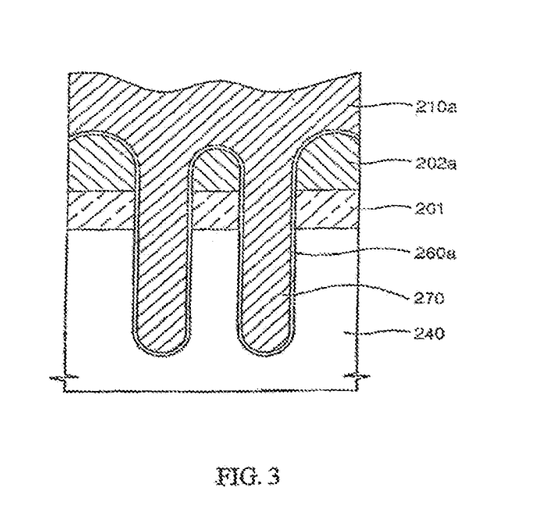
FIG. 3 is a cross-sectional view illustrating a process of forming a recess transistor device according to an exemplary embodiment of the present invention.

Referring to FIG. 3, an insulating layer 260a is formed on the hard mask 203 and along the walls of the recesses 270. A conductive layer 210a is then formed on the insulating layer 260a, filling the recesses 270. According to an exemplary embodiment of the present invention, the insulating layer 260a, which serves as the gate insulation layer, is made with insulating material such as SiO2. The conductive layer is made from a metal group consisting of one of Ti, TiN, W, WN, Ta, TaN, Co, C, Rb, or Ru.

Figure 4:
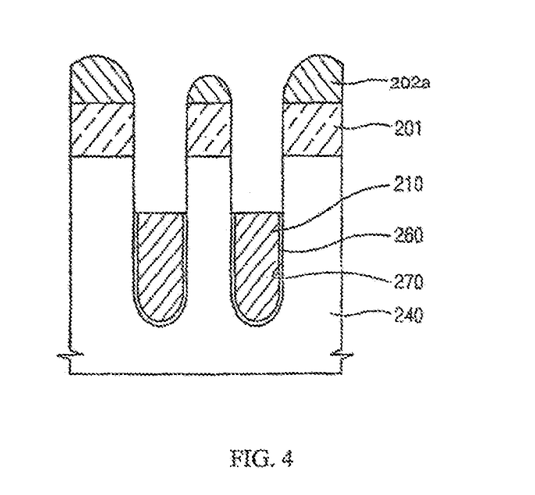
FIG. 4 is a cross-sectional view illustrating a process of forming a recess transistor device according to an exemplary embodiment of the present invention.

Referring to FIG. 4, the conductive layer 210 is etched back within the recesses to leave a conductive layer 210 at a bottom portion of the recess 270. The thickness of the conductive layer 210 left at the bottom portion of the recess 270 is such that there is a spacing between the top surface of the conductive layer 210 and the bottom of the polysilicon pattern 201 (hard mask 203). According to an exemplary embodiment of the present invention, the vertical length of the gap is about the same as the thickness of a source and drain diffusion region (or active layer region) that formed beneath the hard masks 203.

Figure 5:
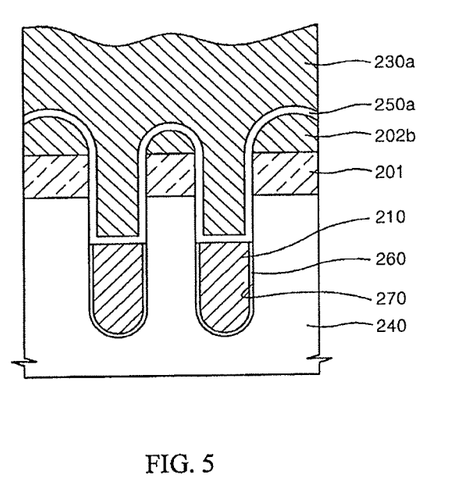
FIG. 5 is a cross-sectional view illustrating a process of forming a recess transistor device according to an exemplary embodiment of the present invention.

Referring to FIG. 5, a buffer 250a is deposited on the hard mask and on top of the conductive layer 210. The buffer layer 250a is made with an insulation material such as SiO2. The buffer layer 250a can be formed by atomic layer deposition (ALD) or by a thermal oxide process at a temperature of about 400° C. to about 800° C., or by chemical vapor deposition (CVD) at lower temperatures. A capping layer 230a is then formed over the buffer layer 250a. The capping layer is an insulator made from one of an oxide, nitride, SiO2, SiON, SixNy, or silicon nitride.

Figure 6:
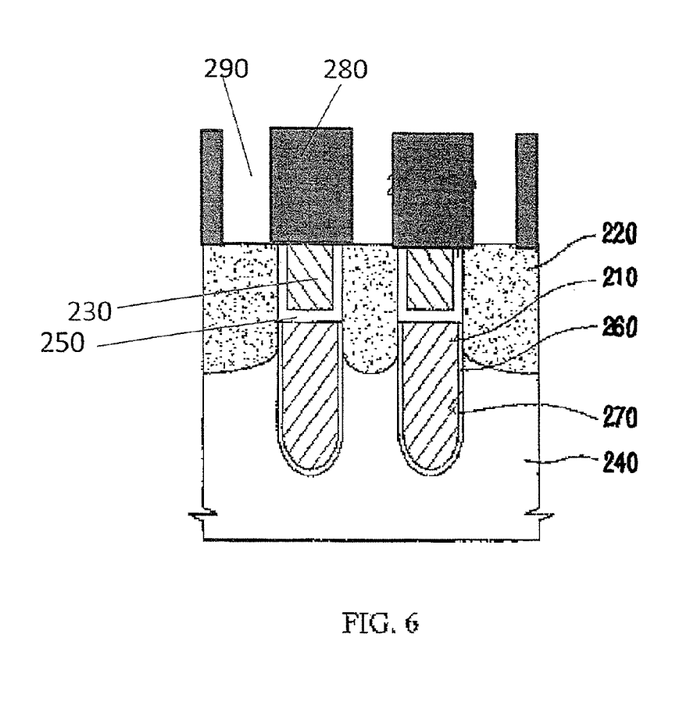
FIG. 6 is a cross-sectional view of a recess transistor device according to an exemplary embodiment of the present invention.

Referring to FIG. 6, according to an exemplary embodiment of the present invention, the capping layer is planarized, to remove the hard mask including the SiN layer 202a and the polysilicon layer 201 and to expose a top surface of substrate 240 coplanar with a top surface of capping pattern 230 surrounded by buffer pattern 250. The planarization process can be by chemical mechanical polishing (CMP). Source and drain electrodes and contacts are then formed above the diffusion region 220 by depositing an interlayer dielectric (ILD) layer 280 on the planarized capping layer. The ILD layer is then etched to form vias (holes) 290 to receive metal deposited therethrough to form contacts (not shown). Dielectric material such as Boron-doped Phospho-Silicate Glass (BPSG) may be used.

In an exemplary embodiment of the present invention, it is contemplated that the recess gates thus formed are used in cell areas that are dimension critical, and as an example, during the ILD layer etch process to form vias, the buffer pattern 250 (SiO2) may be exposed to etching when there is an overlap of the hole area with the buffer pattern 250. If the etch selectivity of buffer pattern 250 (or the capping pattern 230) is the same, a portion of buffer pattern 250 will be consumed, and the diffusion region 220 may be exposed. According to an exemplary embodiment of the present invention, the etch selectivity of the materials used to form the buffer pattern 250 and the ILD layer is such that during the ILD etching process, the buffer pattern 250 is not removed. Thus, the etch selectivity of the ILD layer is selected to be higher than that of the buffer pattern. According to an alternative embodiment of the present invention, the etch selectivity ratio from the capping layer to the ILD layer is higher than the etch selectivity ratio from the ILD to the buffer layer.

Figure 7:
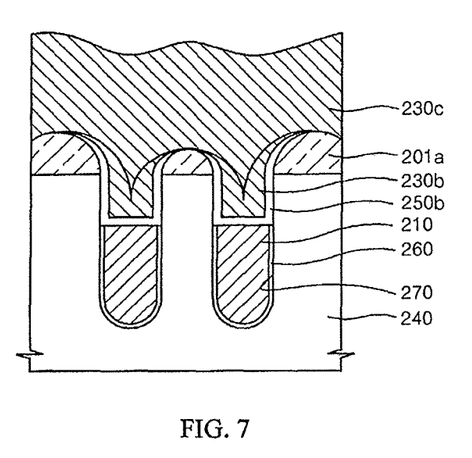
FIG. 7 is a cross-sectional view showing a process of forming a recess transistor device in accordance with another exemplary embodiment of the present invention.

According to another exemplary embodiment of the present invention, a semiconductor device is first formed according to the processes as described above and as shown in FIGS. 1 to 5, wherein substrate 240, hard masks 301, recesses 270, liner 260, conductive layer 210, buffer layer 250a, capping layer 230a are formed. Referring to FIG. 7, etch back is then performed to remove an initial capping layer 230b and the buffer layer 250 near the recesses 270, and within the recesses 270 a portion of the capping layer 230b, to leave intact the buffer layer 250b and a portion of the capping layer 230b immediately above the conductive layer 210. A second capping layer 230c is then formed over the initial capping layer 230b within and near the recesses 270. The second capping layer 230c is formed using an insulation material such as nitride. The capping layer 230 thus formed comprises a first capping layer 230b and a second capping layer 230c.

Figure 8:
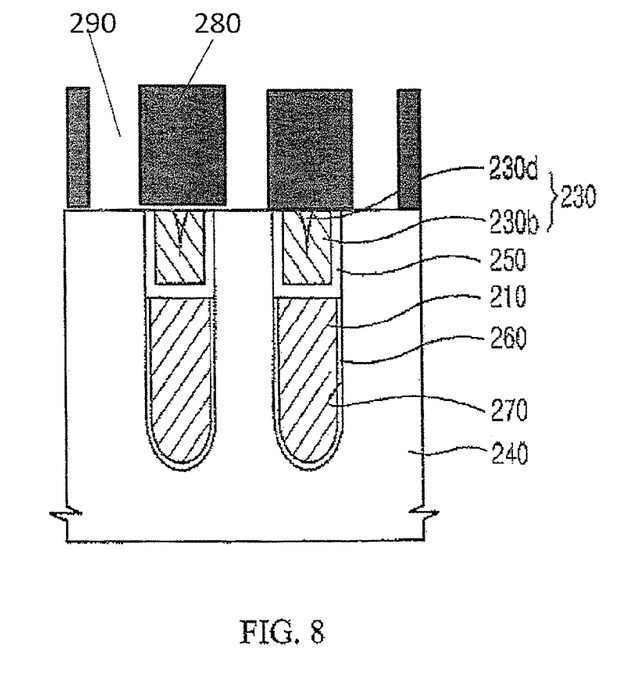
FIG. 8 is a cross-sectional view of a recess transistor device in accordance with another exemplary embodiment of the present invention.

Referring to FIG. 8, the capping layer is planarized, to remove the hard mask including the SiN layer 202a and the polysilicon layer 201 and to expose a top surface of substrate 240 coplanar with a top surface of capping pattern 230 comprising an initial capping pattern 230b and a second capping pattern 230d, surrounded by buffer pattern 250. The planarization process can be by chemical mechanical polishing (CMP). Source and drain electrodes and contacts are then formed above the diffusion region 220 by depositing an interlayer dielectric (ILD) layer on the planarized capping layer. The ILD layer is then etched to form vias (holes) to receive metal deposited therethrough to form contacts (not shown). Dielectric material such as Boron-doped Phospho-Silicate Glass (BPSG) may be used.

Figure 9:
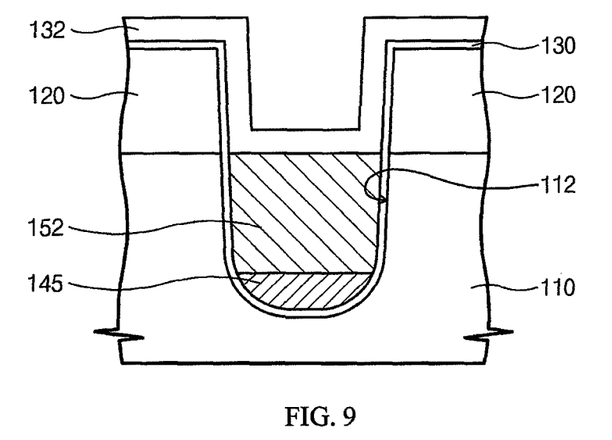
FIG. 9 is a cross-sectional view of a recess transistor device in accordance with still another exemplary embodiment of the present invention.

FIG. 9 shows a recess gate according to still another embodiment of the invention. a substrate 110 based on a semiconductor material such as silicon is first formed. A recess 112 is formed with a predetermined depth in a portion of the substrate 110; a source and drain layer 120 is formed on the substrate 110; then a gate insulation layer 130 is deposited along the sidewalls of the recess 112 and on top of the source and drain layer 120.

The recess 112 is filled with a first conductive layer, which forms over the gate insulation layer 130. The first conductive layer is formed by using a material selected from a group consisting of Ti, TiN, W, WN, Ta, TaN, Co, C, Rb, or Ru. A first conductive layer pattern 145 is obtained by etching back the first conductive layer. The first conductive layer pattern 145 thus occupies the bottom portion of the recess 112. According to an exemplary embodiment of the present invention, the first conductive layer pattern 145 has a thickness that ranges between about 500 A. to about 1,500 A., from a thin pattern filling the rounded bottom portion of the recess 112 to a pattern having a top surface that approaches close to the bottom of the source and drain layer 120. A gap of a predetermined length therefore exists between the first conductive layer pattern 145 and the source and drain layer 120.

A second conductive layer is deposited on the first conductive layer pattern 145 and the gate insulation layer 130. The second conductive layer pattern 152 is obtained by patterning the second conductive layer to have a portion filling the entire portion of recess 112 above the first conductive layer pattern 145, and extending to a thickness above the top of the recess 112. During operation, the entire thickness of the first conductive layer pattern 145, along with a portion of the second conductive layer pattern 152 adjacent to the first conductive layer pattern 145, acts to diffuse the source and drain via a channel area 115 that exists along the exterior profile of the recess 112 in the vicinity beneath the source and drain layer 120. According to an exemplary embodiment of the present invention, the second conductive layer is formed using a polysilicon material such as n-type or p-type polysilicon. Alternatively, the second conduction layer can be formed using a metallic material from a group consisting of Ti, TiN, W, WN, Ta, TaN, Co, C, Rb, or Ru. It is noted that the workfunction of the first conductive layer materials is generally higher than that of polysilicon, the material that can be used to fill the recess 112. According to an exemplary embodiment, titanium nitride, TiN, is used as a first conductive material to fill the recess 112. TiN has a workfunction of about 4.6. As a comparison, n-type polysilicon has a workfunction of about 4.1 given the same dimensions. Given the same threshold voltages applied to a recess gate, the Ion current is higher when TiN is the material used as the first conductive layer 145 as compared to use of polysilicon as the first conductive layer. The first conductive layer 145 can be formed by one of sputtering, Chemical Vapor Deposition (CVD), Atomic Layer Deposition (ALD), or like processes.

According to an embodiment of the present invention, the second conductive layer pattern 152 has a workfunction that can be less than or greater than the workfunction of the first conductive layer pattern 145, depending on whether the recess gate thus formed is part of an NMOS device or a PMOS device. For example, if the recess gate is part of an NMOS device, the polysilicon used for the second conductive layer 152 has a workfunction less than or equal to that of the first conductive layer pattern 145. Conversely, if the recess gate is part of a PMOS device, the polysilicon used for the second conductive layer pattern 152 has a workfunction that is equal or greater than that of the first conductive layer pattern 145. According to this exemplary embodiment of the present invention, the thickness of the second conductive layer pattern 152 is greater than the thickness of the first conductive layer pattern 145. According to an alternative embodiment of the present invention, the thickness of the first conductive layer pattern 145 can be equal to or greater than the thickness of the second conductive layer pattern 152.

A buffer layer 132 is then formed above the second conductive layer pattern 152 and gate insulating layer 130. A capping layer (not shown) is then formed over the buffer layer 132. Upon planarization, a semiconductor device having a recess gate according to the present embodiment is thus formed.

Alternatively, the device as shown in FIG. 9 includes a first conductive layer formed using a metal from one of a material in a group consisting of Ti, TiN, W, WN, Ta, TaN, Ru, Co, C or Rb, and a second conductive layer formed using a metal from one of a material in a group consisting of Ti, TiN, W, WN, Ta, TaN, Co, C, Rb, or Ru. The buffer layer 132 is made with material such as SiO2, using ALD or thermal oxide processes, at a temperature between 400° C. to 800° C. The capping layer is made from an insulating material such as nitride.

It is contemplated that the recess gates according to at least one embodiment of the present invention described above is utilized in different portions of a semiconductor device. For example, in a semiconductor memory device wherein the substrate is partitioned into a cell region, a core region, and a peripheral region, the recess gates are disposed in the memory cell region and not in the core region or the peripheral region.

It is further contemplated that a recess gate transistor according to at least one embodiment of the present invention heretofore described is utilized in semiconductor memory devices, which in turn are being applied to a number of applications, particularly when packaged in an enclosed card that is removably connected with a host system. Current commercial memory card formats include that of the Personal Computer Memory Card International Association (PCM-CIA), CompactFlash (CF), MultiMediaCard (MMC) and Secure Digital (SD). Host systems with which such cards are used include personal computers, notebook computers, hand held computing devices, cameras, audio reproducing devices, and the like.

Figure 10:
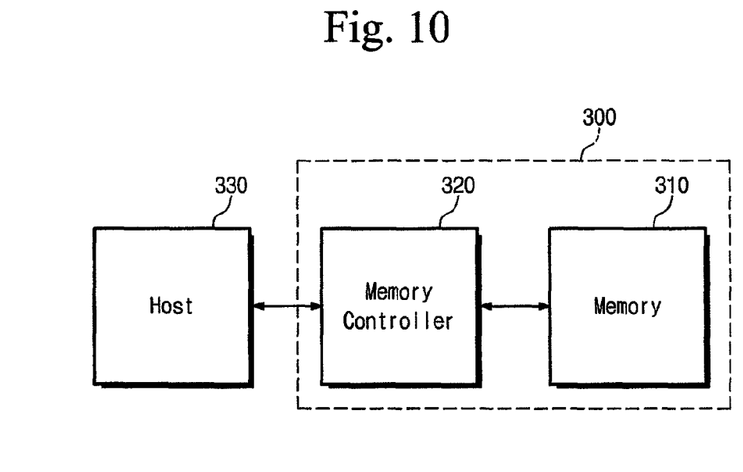
FIG. 10 shows a diagram of a memory card having a recess gate transistor according to an exemplary embodiment of the present invention.

Referring to FIG. 10, a memory system including a semiconductor device according to at least one embodiment of the present invention will be described. A memory system 300 includes a memory controller 320 and a memory 310 having a recess gate transistor according to at least one embodiment of the present invention. The memory controller 320 controls the memory device 310 to read or write data from/into the memory 310 in response to a read/write request of a host 330. The memory controller 320 may include an address mapping table for mapping an address provided from the host 330 (e.g., mobile devices or computer systems) into a physical address of the memory device 310.

Figure 11:
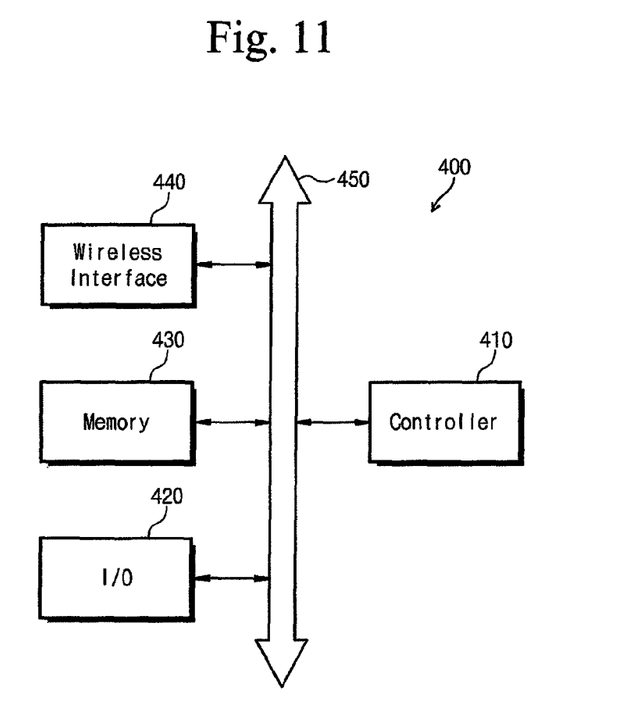
FIG. 11 shows a diagram of an electronic device having a recess gate transistor according to an exemplary embodiment of the present invention.

Referring to FIG. 11, an electron device including a semiconductor device according to exemplary embodiments of the present invention will be described. The electron device 400 may be used in a wireless communication device (e.g., a personal digital assistant, a laptop computer, a portable computer, a web tablet, a wireless telephone, a mobile phone and/or a wireless digital music player.) or in any device capable of transmitting and/or receiving information via wireless environments.

The electron device 400 includes a controller 410, an input/output (I/O) device 420 (e.g., a keypad, a keyboard, and a display), a memory 430 having a recess gate transistor according to at least one embodiment of the present invention, and a wireless interface 440. The controller 410 may include at least one of a microprocessor, a digital signal processor, or a similar processing device. The memory 430 may be used to store commands executed by the controller 410, for example. The memory 430 may be used to store user data. The memory 430 includes a semiconductor device according to at least one embodiment of the present invention. The electron device 400, may utilize the wireless interface 440 to transmit/receive data via a wireless communication network. For example, the wireless interface 440 may include an antenna and/or a wireless transceiver. The electron device 400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

Figure 12:
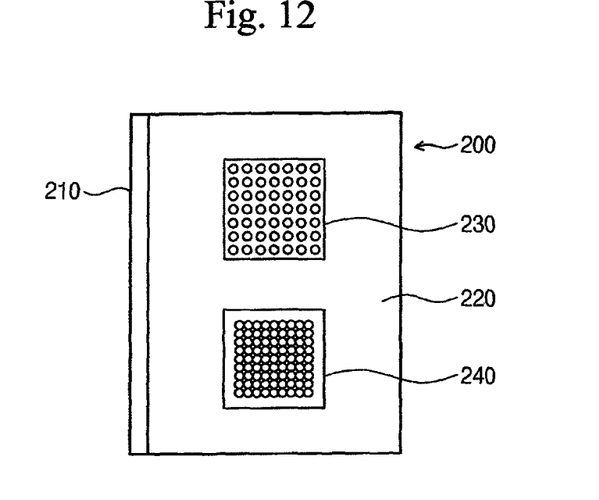
FIG. 12 shows a modular memory device having a semiconductor device according to an exemplary embodiment of the present invention.

Referring to FIG. 12, a modular memory device including a semiconductor device according to exemplary embodiments will be described. The modular memory device 200 may include a printed circuit board 220. The printed circuit board 220 may form one of the external surfaces of the modular memory device 200. The printed circuit board 220 may support a memory unit 230, a device interface unit 240, and an electrical connector 210.

The memory unit 230 having a recess gate transistor according to at least one embodiment of the present invention may include a three-dimensional memory array and may be connected to a memory array controller. The memory array may include the appropriate number of memory cells arranged in a three-dimensional lattice on the printed circuit board 220. The device interface unit 240 may be formed on a separated substrate such that the device interface unit 240 may be electrically connected to the memory unit 230 and the electrical connector 210 through the printed circuit board 220. Additionally, the memory unit 230 and the device interface unit 240 may be directly mounted on the printed circuit board 220. The device interface unit 240 may include components necessary for generating voltages, clock frequencies, and protocol logic.

While this invention has been described as having a preferred design, the present invention can be further modified within the spirit and scope of this disclosure. This application is therefore intended to cover any variations, uses, or adaptations of the present invention using the general principles disclosed herein. Furthermore, this application is intended to cover such departures from the present disclosure as come within the known or customary practice in the art to which this invention pertains and which fall within the limits of the appended claims.

The invention claimed is:

1. A method of forming a semiconductor device, comprising:
    forming a substrate and an active layer at a top portion of the substrate;
    forming a polysilicon layer on the active layer;
    forming a first insulation layer on the polysilicon layer;
    forming a plurality of masks by patterning the first insulating layer and the polysilicon layer;
    forming a plurality of trenches having trench walls in the substrate, each trench disposed between two adjacent masks and extending vertically from a bottom portion to an upper portion;
    forming a second insulating layer on the trench walls;
    forming a conductive layer on the second insulating layer;
    etching the conductive layer to form conductive layer patterns to fill the bottom portions of the trenches;
    depositing a buffer layer on the conductive layer patterns and the trench walls;
    filling the upper portions of the trenches with a capping layer;
    planarizing the capping layer, the buffer layer, and the hard masks to expose the active layer at the top portion of the substrate;
    forming an ILD layer on active layer, the buffer layer, and the capping layer; and
    etching the ILD layer above the active layer to form contact holes.

2. The method of claim 1, wherein the etch selectivity from the ILD layer to the capping layer is higher than the etch selectivity from the ILD layer to the buffer layer.

* * * * *

UNITED STATES PATENT AND TRADEMARK OFFICE
CERTIFICATE OF CORRECTION

PATENT NO.         : 8,889,539 B2                                  Page 1 of 1
APPLICATION NO.    : 12/332877
DATED              : November 18, 2014
INVENTOR(S)        : Ho-In Ryu et al.

It is certified that error appears in the above-identified patent and that said Letters Patent is hereby corrected as shown below:

Title Page, item (75),

THE PATENT INCORRECTLY INDICATES THE SPELLING OF THE SECOND (2ND) AND FOURTH (4TH) INVENTORS:

SECOND (2ND) INVENTOR NAME: BONG-SU KIM

FOURTH (4TH) INVENTOR NAME: HO-JUN LEE

THE SECOND (2ND) AND FOURTH (4TH) INVENTORS NAMES SHOULD READ:

SECOND (2ND) INVENTOR NAME: BONG-SOO KIM

FOURTH (4TH) INVENTOR NAME: HO-JUN YI

Signed and Sealed this
Twenty-first Day of April, 2015

Michelle K. Lee
*Director of the United States Patent and Trademark Office*